(12) United States Patent
Choi et al.

(10) Patent No.: US 8,287,333 B2
(45) Date of Patent: Oct. 16, 2012

(54) SINGLE TYPE SUBSTRATE TREATING APPARATUS AND METHOD

(75) Inventors: Ki Hoon Choi, Cheonan-si (KR); Gyo-Woog Koo, Cheonan-si (KR); Jung Bong Choi, Seoul (KR)

(73) Assignee: Semes Co., Ltd (KR)

( * ) Notice: Subject to any disclaimer, the term of this patent is extended or adjusted under 35 U.S.C. 154(b) by 986 days.

(21) Appl. No.: 12/273,064

(22) Filed: Nov. 18, 2008

(65) Prior Publication Data

US 2009/0305613 A1    Dec. 10, 2009

(51) Int. Cl.
   *B24B 1/00*    (2006.01)
(52) U.S. Cl. ......... 451/67; 451/285; 451/287; 451/443
(58) Field of Classification Search ............. 451/36, 451/285–289, 443, 56, 57, 67, 280
   See application file for complete search history.

(56) References Cited

U.S. PATENT DOCUMENTS

| | | | |
|---|---|---|---|
| 4,393,628 A * | 7/1983 | Ottman et al. | 451/63 |
| 5,545,076 A * | 8/1996 | Yun et al. | 451/287 |
| 5,653,624 A * | 8/1997 | Ishikawa et al. | 451/287 |
| 5,888,124 A * | 3/1999 | Lin et al. | 451/67 |
| 6,042,459 A * | 3/2000 | Honda | 451/274 |
| 6,050,880 A * | 4/2000 | Kato et al. | 451/41 |
| 6,077,153 A * | 6/2000 | Fujita et al. | 451/259 |
| 6,106,369 A * | 8/2000 | Konishi et al. | 451/41 |
| 6,139,428 A * | 10/2000 | Drill et al. | 451/41 |
| 6,213,856 B1 * | 4/2001 | Cho et al. | 451/443 |
| 6,234,868 B1 * | 5/2001 | Easter et al. | 451/5 |
| 6,358,114 B1 | 3/2002 | Walker et al. | |
| 6,358,117 B1 * | 3/2002 | Kato et al. | 451/8 |
| 6,371,838 B1 * | 4/2002 | Holzapfel | 451/72 |
| 6,385,805 B2 | 5/2002 | Konishi et al. | |
| 6,425,801 B1 * | 7/2002 | Takeishi et al. | 451/5 |
| 6,439,962 B1 * | 8/2002 | Ato | 451/6 |
| 6,439,981 B1 * | 8/2002 | Pallinti et al. | 451/287 |
| 6,443,824 B2 * | 9/2002 | Shendon et al. | 451/288 |
| 6,520,895 B2 | 2/2003 | Senga et al. | |
| 6,609,962 B1 | 8/2003 | Wakabayashi et al. | |
| 6,616,512 B2 * | 9/2003 | Sotozaki | 451/54 |
| 6,629,882 B2 * | 10/2003 | Takahashi et al. | 451/286 |
| 6,634,934 B1 * | 10/2003 | Akaike | 451/56 |
| 6,695,680 B2 * | 2/2004 | Choi et al. | 451/5 |
| 6,769,972 B1 * | 8/2004 | Huang et al. | 451/287 |
| 7,081,038 B2 * | 7/2006 | Ina | 451/5 |
| 7,101,261 B2 * | 9/2006 | Shendon et al. | 451/41 |
| 7,134,947 B2 | 11/2006 | Stark et al. | |
| 7,288,165 B2 | 10/2007 | Polyak et al. | |
| 7,513,819 B2 | 4/2009 | Kiuchi et al. | |

(Continued)

FOREIGN PATENT DOCUMENTS

CN    1727112 A    2/2006

(Continued)

*Primary Examiner* — George Nguyen
(74) *Attorney, Agent, or Firm* — Charter IP, LLC; Matthew J. Lattig

(57) ABSTRACT

Provided are a single type substrate treating apparatus and method. A polishing unit is disposed in a process chamber for polishing a substrate chemically and mechanically, and a cleaning unit is disposed in the same process chamber for cleaning the substrate. Therefore, according to the single substrate treating apparatus and method, a polishing process and a cleaning process can be performed on a substrate in the same process chamber by a single substrate treating method in which substrates are treated one by one.

15 Claims, 10 Drawing Sheets

U.S. PATENT DOCUMENTS

| | | |
|---|---|---|
| 7,584,760 B2 | 9/2009 | Miya et al. |
| 7,654,883 B2 * | 2/2010 | Kitahashi et al. ............ 451/41 |
| 7,789,972 B2 | 9/2010 | Edamoto |
| 8,066,550 B2 * | 11/2011 | Higuchi et al. ............ 451/44 |
| 2001/0019934 A1 * | 9/2001 | Nishimura et al. ............ 451/8 |
| 2001/0055937 A1 * | 12/2001 | Wada et al. ............ 451/36 |
| 2002/0013122 A1 | 1/2002 | Sugaya et al. |
| 2003/0153250 A1 * | 8/2003 | Boyd et al. ............ 451/41 |
| 2006/0046413 A1 | 3/2006 | Edamoto |
| 2006/0191484 A1 | 8/2006 | Mitrovic et al. |
| 2006/0205324 A1 | 9/2006 | Mayes et al. |
| 2006/0281393 A1 * | 12/2006 | Jeong ............ 451/41 |
| 2007/0155294 A1 | 7/2007 | Stark et al. |

FOREIGN PATENT DOCUMENTS

| | | |
|---|---|---|
| CN | 101000862 A | 7/2007 |
| JP | 60-108262 A | 6/1985 |
| JP | 09-155733 A | 6/1997 |
| JP | 10-335288 A | 12/1998 |
| JP | 11-135463 A | 5/1999 |
| JP | 11-507598 A | 7/1999 |
| JP | 11-238713 A | 8/1999 |
| JP | 2001-148361 A | 5/2001 |
| JP | 2001-291690 A | 10/2001 |
| JP | 2002-190461 A | 7/2002 |
| JP | 2003-045833 A | 2/2003 |
| JP | 2004-066376 A | 3/2004 |
| JP | 2004-153078 A | 5/2004 |
| JP | 2005-136406 A | 5/2005 |
| JP | 2005-347761 A | 12/2005 |
| JP | 2006-066815 A | 3/2006 |
| JP | 2006-212775 A | 8/2006 |
| JP | 2007-152498 A | 6/2007 |
| JP | 2007-255957 A | 10/2007 |
| KR | 1020070023248 A | 9/2007 |
| TW | 467793 B | 7/2007 |

* cited by examiner

SINGLE TYPE SUBSTRATE TREATING APPARATUS AND METHOD

CROSS-REFERENCE TO RELATED APPLICATIONS

This U.S. non-provisional patent application claims priority under 35 U.S.C. §119 of Korean Patent Application No. 10-2008-0054082, filed on Jun. 10, 2008, the entire contents of which are hereby incorporated by reference.

BACKGROUND OF THE INVENTION

The present invention disclosed herein relates to a semiconductor manufacturing apparatus and method, and more particularly, to a substrate treating apparatus and method for polishing and cleaning a substrate by a single substrate treating method.

In a general semiconductor device manufacturing process, a plurality of processes such as a deposition process, a photo process, and an etching process are repeatedly performed to form and stack thin films on a wafer. Such processes are repeated until a desired circuit pattern is formed on the wafer, and the surface of the wafer becomes uneven after the circuit pattern is formed. Recent highly-integrated semiconductor devices have a multi-layer structure, many surface bends, and increased height differences between the surface bends. Since troubles, such as defocusing in a photo process, are caused by an uneven surface of a wafer, the uneven surface of the wafer should be periodically polished for planarizing the uneven surface of the wafer.

Various surface planarization techniques have been developed for planarizing the surface of a wafer, and a chemical mechanical polishing (CMP) technique is widely used among such planarization techniques because wide surfaces as well as narrow surfaces can be planarized with good flatness by using the CMP technique. A CMP apparatus is used to polish the surface of a wafer coated with tungsten or an oxide by using mechanical friction and chemical abrasives, and fine polishing is possible using the CMP apparatus.

Furthermore, in the case of recent high-density, highly-integrated, and high-performance semiconductor devices having very fine circuit patterns, the characteristics and process yield of the devices are largely affected by contaminants such as particles, organic contaminants, and metal contaminants remaining on the surface of a substrate. Therefore, in semiconductor manufacturing processes, a cleaning process for removing various contaminants attached to the surface of a substrate is considered more important than before, and thus the cleaning process is performed before and after each semiconductor manufacturing process to clean the substrate.

SUMMARY OF THE INVENTION

The present invention provides a single type substrate treating apparatus and method such that a polishing process and a cleaning process can be performed on a substrate in the same process chamber by a single substrate treating method in which substrates are treated one by one.

Objects of the present invention are not limited to those mentioned above, and other objects of the present invention will be apparently understood by those skilled in the art through the following description.

Embodiments of the present invention provide single type substrate treating apparatuses include: a process chamber in which a substrate treating process is performed; a substrate supporting unit rotatably disposed in the process chamber for placing a substrate on the substrate supporting unit; a polishing unit disposed in the process chamber at a side of the substrate supporting unit for polishing the substrate chemically and mechanically; and a cleaning unit disposed in the process chamber at another side of the substrate supporting unit for cleaning the substrate.

In some embodiments, the polishing unit may include: a polishing head on which a polishing pad is mounted to polish the substrate; a first driving member configured to rotate the polishing head on a center of the polishing head; a second driving member configured to move the polishing head on a horizontal plane; and a third driving member configured to move the polishing head upward and downward.

In other embodiments, the polishing head may include: a housing having a cylindrical shape with an opened bottom side; a polishing pad holder disposed at the opened bottom side of the housing for coupling with the polishing pad; a vertically extendable bellows disposed on a top surface of the polishing pad holder; and a pneumatic member configured to apply an air pressure to the bellows.

In still other embodiments, the polishing pad may be attached to a side of a metal plate, and the polishing pad holder may include a magnet member configured to exert a magnetic force to the metal plate such that the other side of the metal plate may be detachably attached to the polishing pad holder.

In even other embodiments, the first driving member may include: a first driving motor; a first driving pulley in which a rotation shaft of the first driving motor is inserted; a first driven pulley in which the pneumatic member is installed; and a first belt wound around the first driving pulley and the first driven pulley for transmitting rotation power of the first driving motor from the first driving pulley to the first driven pulley.

In yet other embodiments, the second driving member may include: a swing arm having an end horizontally coupled to the housing; a vertical arm vertically coupled to the other end of the swing arm; and a second driving motor configured to provide rotation power to the vertical arm.

In further embodiments, the single type substrate treating apparatus may further include: a second driving pulley in which a rotation shaft of the second driving motor is inserted; a second driven pulley in which the vertical arm is inserted; and a second belt wound around the second driving pulley and the second driven pulley for transmitting rotation power of the second driving motor from the second driving pulley to the second driven pulley.

In still further embodiments, the first driving motor and the first driving pulley of the first driving member may be disposed in the swing arm, and the first belt may be wound around the first driving pulley and the first driven pulley through an inside area of the swing arm.

In even further embodiments, the third driving member may include: a supporting block configured to rotatably support the vertical arm; and a linear driving unit configured to linearly move the supporting block upward and downward.

In yet further embodiments, the single type substrate treating apparatus may further include a guide member configured to guide upward and downward linear movements of the supporting block.

In some embodiments, the first driving member may rotate the polishing pad in a direction opposite to a rotation direction of the substrate placed on the substrate supporting unit.

In other embodiments, the single type substrate treating apparatus may further include a pad conditioning unit disposed at another side of the substrate supporting unit to polish the polishing pad of the polishing unit for adjusting surface roughness of the polishing pad.

In still other embodiments, the pad conditioning unit may include: a process tub having an opened top side for accommodating an end of the polishing head on which the polishing pad is mounted; and a diamond conditioner disposed at a bottom surface of the process tub for polishing the polishing pad by contact with the polishing pad.

In even other embodiments, the diamond conditioner may have a ring shape and be provided in plurality at the bottom surface of the process tub.

In yet other embodiments, the bottom surface of the process tub may include a first bottom surface and a second bottom surface lower than the first bottom surface, and the diamond conditioner may be disposed at the first bottom surface.

In further embodiments, the single type substrate treating apparatus may further include: a first deionized water supply member connected to the first bottom surface for supplying deionized water to an inside area of the process tub through the first bottom surface; and a drain member connected to the second bottom surface for allowing deionized water supplied to the inside area of the process tub to be discharged through the second bottom surface.

In still further embodiments, the single type substrate treating apparatus may further include a second deionized water supply member disposed at the process tub for supplying deionized water to the inside area of the process tub toward the first bottom surface.

In even further embodiments, the third driving member may move the polishing head accommodated in the process tub upward and downward for bringing the polishing pad into contact with the diamond conditioner, the second driving member may move the polishing head on a horizontal plane for scanning the polishing head on the diamond conditioner, and the first driving member may rotate the polishing pad.

In yet further embodiments, the cleaning unit may include: a cleaning liquid supply member configured to supply a cleaning liquid in a direction toward the substrate; and a supersonic cleaning member configured to apply supersonic waves to the cleaning liquid supplied to the substrate.

In other embodiments of the present invention, there are provided methods for treating substrates one by one, the methods include bringing a polishing pad into contact with a top surface of a substrate so as to polish the top surface of the substrate, wherein the polish pad is brought into tight contact with the substrate by extending a bellows disposed at an upper side of the polishing pad.

In some embodiments, the substrate may be polished by the polishing pad while the polishing pad is rotated in a direction opposite to a rotation direction of the substrate.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
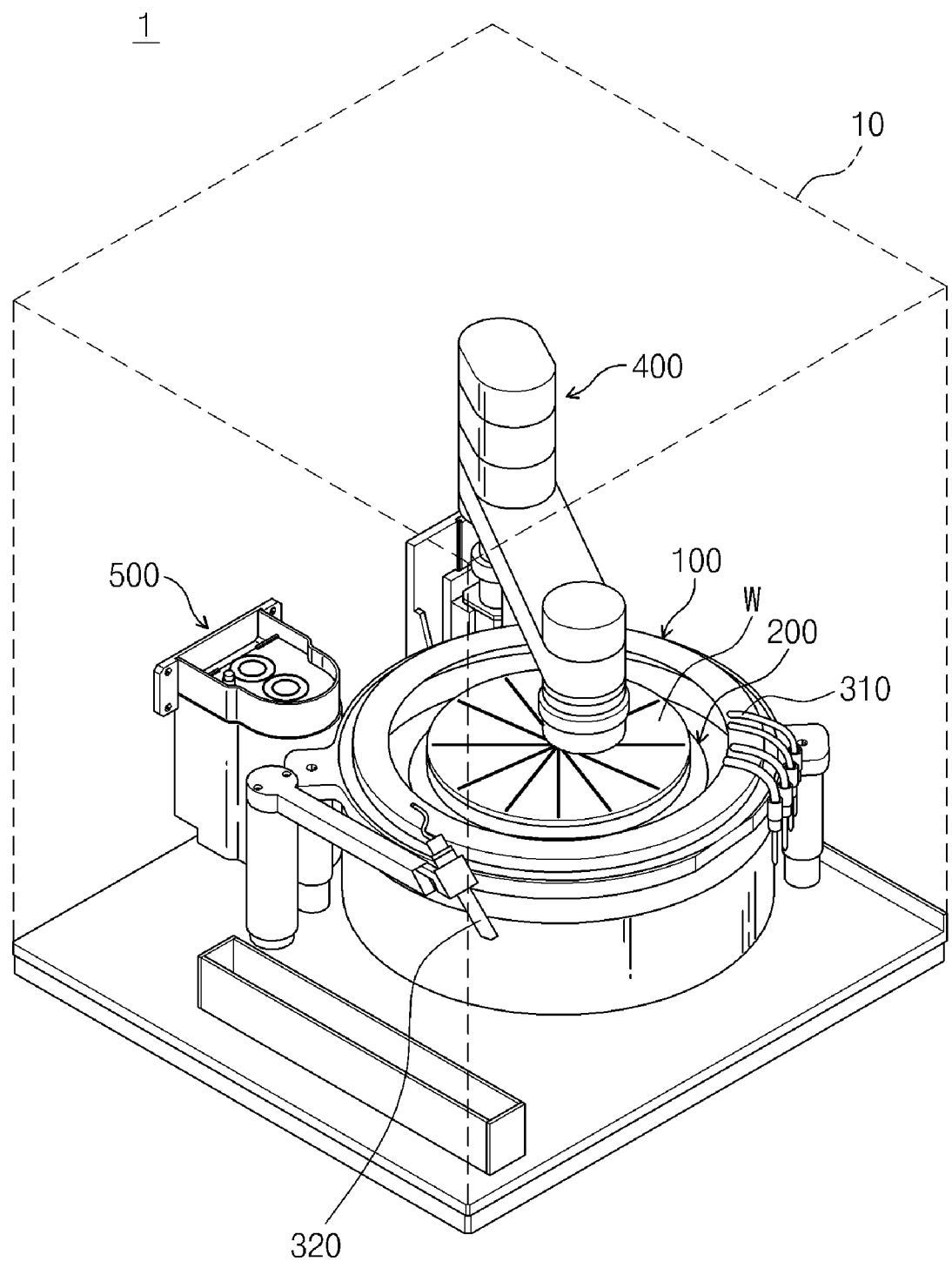
FIG. 1 is a perspective view illustrating a single type substrate treating apparatus according to an embodiment of the present invention.

A single type substrate treating apparatus and method will now be described below in more detail with reference to the accompanying drawings, in which exemplary embodiments of the invention are shown. In the figures, elements are indicated by reference numerals, and the same or similar elements may be indicated by the same reference numerals. In the following descriptions, well-known structures and functions will not be described in detail to avoid ambiguous interpretation of the present invention.

(Embodiment)

FIG. 1 is a perspective view illustrating a single type substrate treating apparatus 1 according to an embodiment of the present invention.

Referring to FIG. 1, the single type substrate treating apparatus 1 of the current embodiment includes a process vessel 100, a substrate supporting unit 200, cleaning units 310 and 320, a polishing unit 400, and a pad conditioning unit 500. According to the single type substrate treating apparatus 1 of the current embodiment, a substrate can be polished and cleaned in the same process chamber 10. Therefore, the cleaning units 310 and 320, the polishing unit 400, and the pad conditioning unit 500 may be disposed around the process vessel 100 and the substrate supporting unit 200 in the process chamber 10.

The process vessel 100 has a cylindrical shape with an opened top side and provides a space in which a substrate W can be processed. A substrate W can be loaded into the process vessel 100 and unloaded from the process vessel 100 through the opened top side of the process vessel 100. The substrate supporting unit 200 is disposed in the process vessel 100. During a process, the substrate supporting unit 200 fixes a substrate W introduced into the process vessel 100. The cleaning units 310 and 320, the polishing unit 400, and the pad conditioning unit 500 are disposed around the process vessel 100. The cleaning unit 310 may be a cleaning liquid supply member configured to supply cleaning liquid to a substrate W fixed to the substrate supporting unit 200 for cleaning the substrate W, and the cleaning unit 320 may be a supersonic cleaning member configured to apply suppersonic waves to the cleaning liquid supplied to the substrate W for increasing cleaning efficiency. The polishing unit 400 is used to polish a substrate W chemically and mechanically, and the pad conditioning unit 500 is used to polish a polishing pad of the polishing unit 400 for adjusting the surface roughness of the polishing pad.

Figure 2:
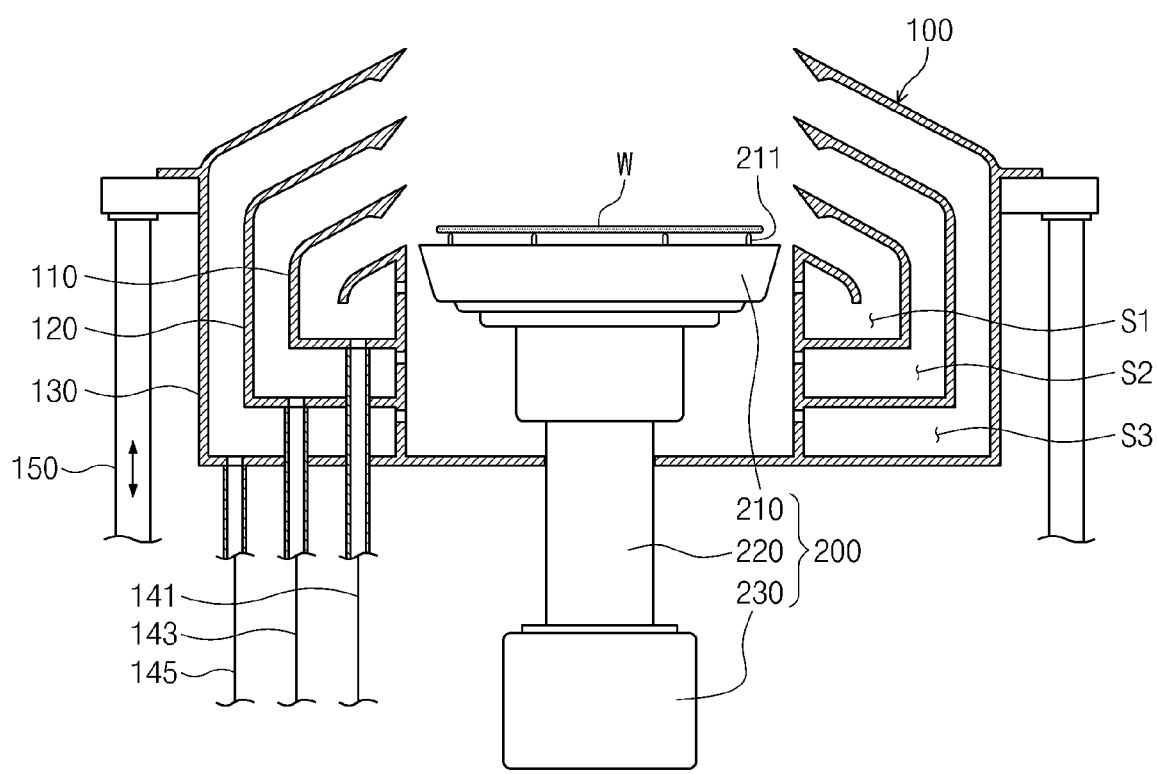
FIG. 2 is a side sectional view illustrating a process vessel and a substrate supporting unit of FIG. 1.

FIG. 2 is a side sectional view illustrating the process vessel 100 and the substrate supporting unit 200 of FIG. 1.

Referring to FIG. 2, the process vessel 100 includes a first collecting barrel 110, a second collecting barrel 120, and a third collecting barrel 130, which have a cylindrical shape. In the current embodiment, the process vessel 100 includes three collecting barrels; however, the number of collecting barrels can be increased or decreased. The first, second, and third collecting barrels 110, 120, and 130 are used to collect cleaning liquid supplied to a substrate W during a substrate processing process. In the substrate polishing apparatus 1, a substrate W is cleaned by cleaning liquid while the substrate W is rotated by the substrate supporting unit 200. Thus, cleaning liquid supplied to the substrate W can be scattered from the substrate W. The first, second, and third collecting barrels 110, 120, and 130 are used to collect the scattered cleaning liquid.

The first, second, and third collecting barrels 110, 120, and 130 form first, second, and third collecting spaces S1, S2, and S3 to which cleaning liquid scattered from a substrate W is introduced. The first collecting barrel 110 forms the first collected space S1 to collect a first collecting liquid used to process a substrate W first. The second collecting space S2 is formed between the first and second collecting barrels 110 and 120 to collect a second cleaning liquid used to process the substrate W secondly. The third collecting space S3 is formed between the second and third collecting barrels 120 and 130 to collect a third cleaning liquid used to process the substrate W thirdly.

The first collecting barrel 110 is connected to a first collecting line 141. The first cleaning liquid collected in the first collected space S1 is discharged to the outside through the first collecting line 141. The second collecting barrel 120 is connected to a second collecting line 143. The second cleaning liquid collected in the second collecting space S2 is discharged to the outside through the second collecting line 143. The third collecting barrel 130 is connected to a third collecting line 145. The third cleaning liquid collected in the third collecting space S3 is discharged through the third collecting line 145.

A vertical mover 150 may be coupled to the process vessel 100 to change the vertical position of the process vessel 100. The vertical mover 150 is disposed at an outer wall of the third collecting barrel 130 to move the process vessel 100 upward and downward while the vertical position of the substrate supporting unit 200 is fixed. Therefore, the relative vertical positions of the process vessel 100 and the substrate W can be changed. Accordingly, different cleaning liquids can be collected in the collecting spaces S1, S2, and S3 of the process vessel 100.

The substrate supporting unit 200 is disposed in the process vessel 100. During a process, the substrate supporting unit 200 supports a substrate W and may be rotated by a driving unit 230 (described later). The substrate supporting unit 200 includes a supporting plate 210 having a circular top surface, and pin members 211 are disposed at the top surface of the supporting plate 210 for supporting a substrate W. A supporting shaft 220 is connected to the bottom side of the supporting plate 210 for supporting the supporting plate 210, and the supporting shaft 220 can be rotated by the driving unit 230 connected to the bottom side of the supporting shaft 220. The driving unit 230 may be a motor. As the supporting shaft 220 is rotated by the driving unit 230, the supporting plate 210 and a substrate W are rotated. When a substrate is loaded on the supporting plate 210 or unloaded from the supporting plate 210, the supporting plate 210 can be moved upward or downward by the driving unit 230. Besides, the supporting plate 210 can be moved upward or downward for other purposes.

Figure 3:
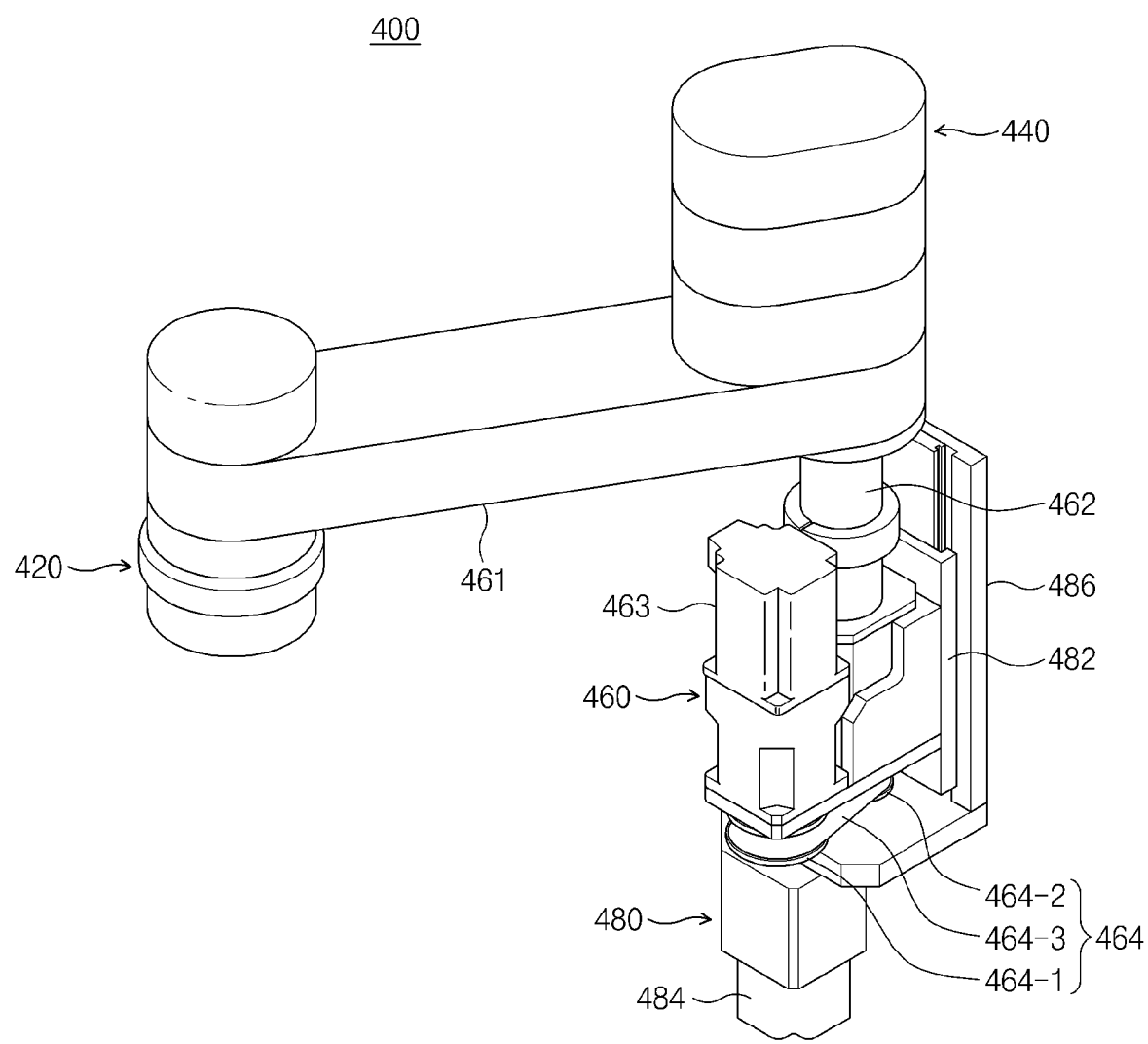
FIG. 3 is a perspective view illustrating a polishing unit of FIG. 1.
Figure 4:
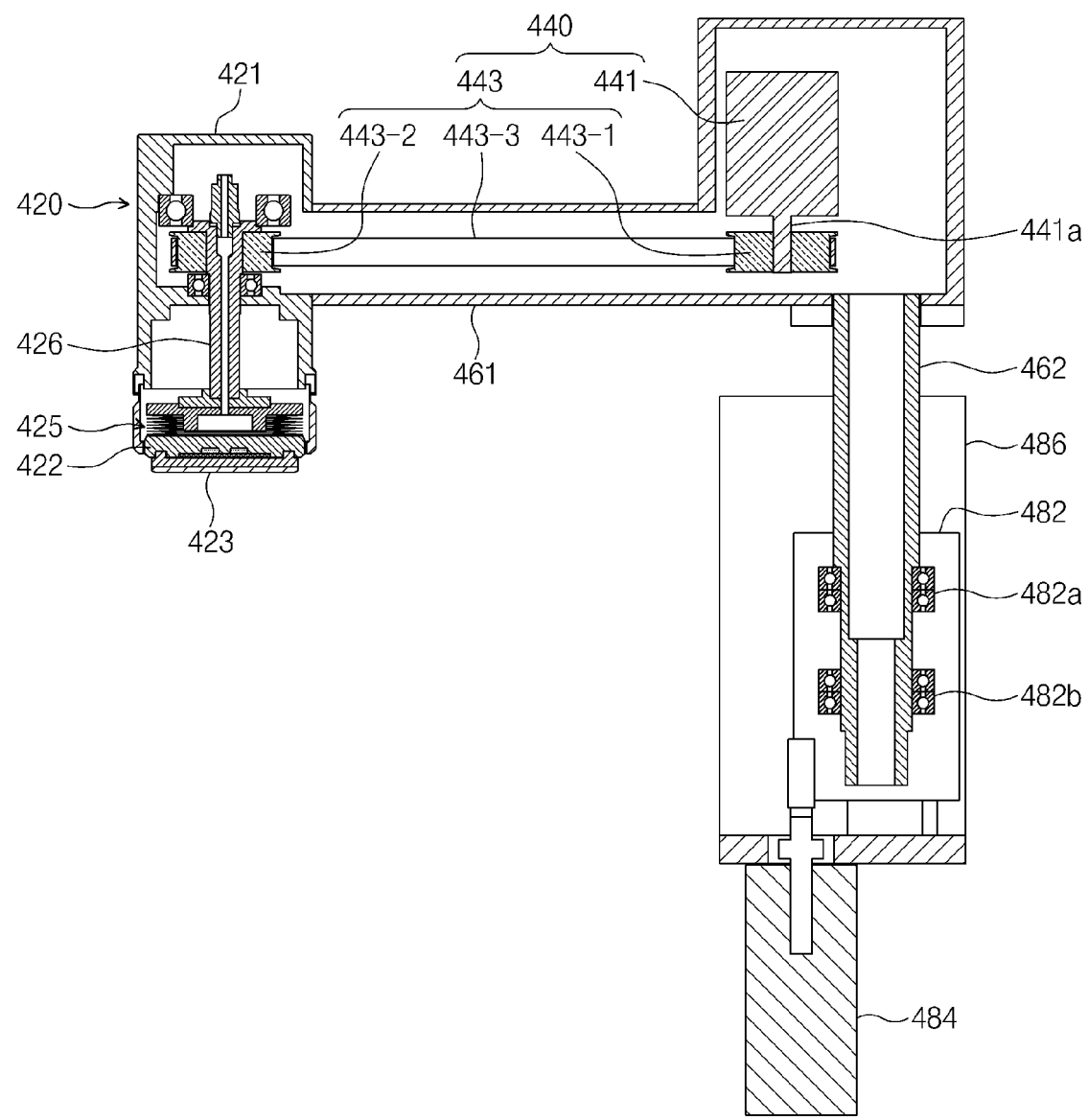
FIG. 4 is a side sectional view illustrating the polishing unit of FIG. 3.
Figure 5:
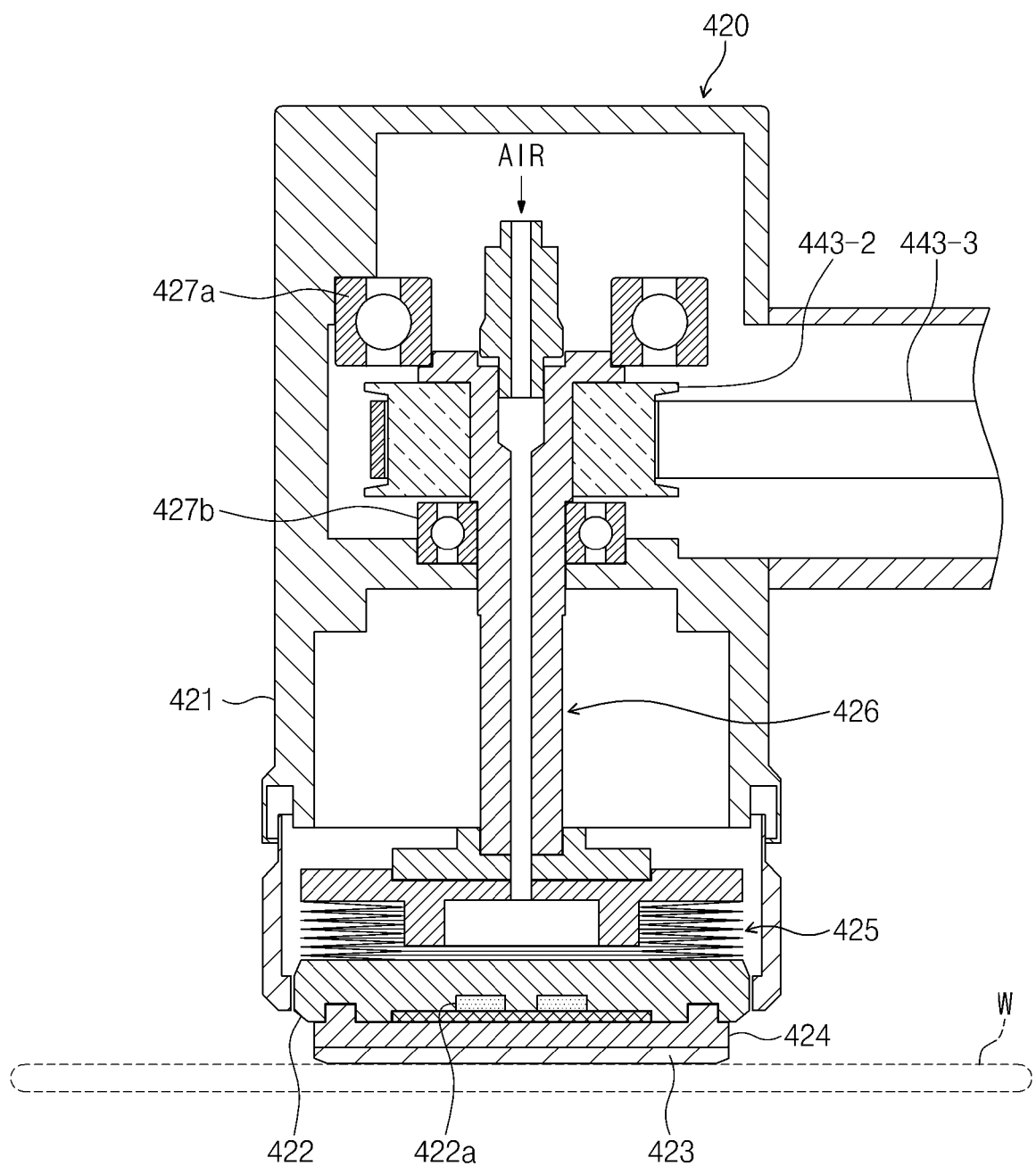
FIG. 5 is an enlarged view illustrating a polishing head of FIG. 4.
Figure 6A:
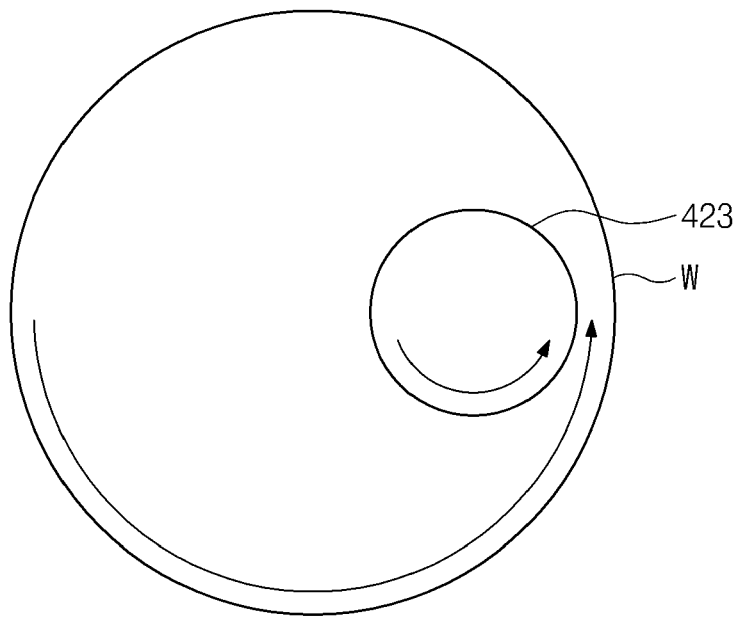
FIGS. 6A and 6B are view for illustrating an exemplary polishing process using a polishing pad.
Figure 6B:
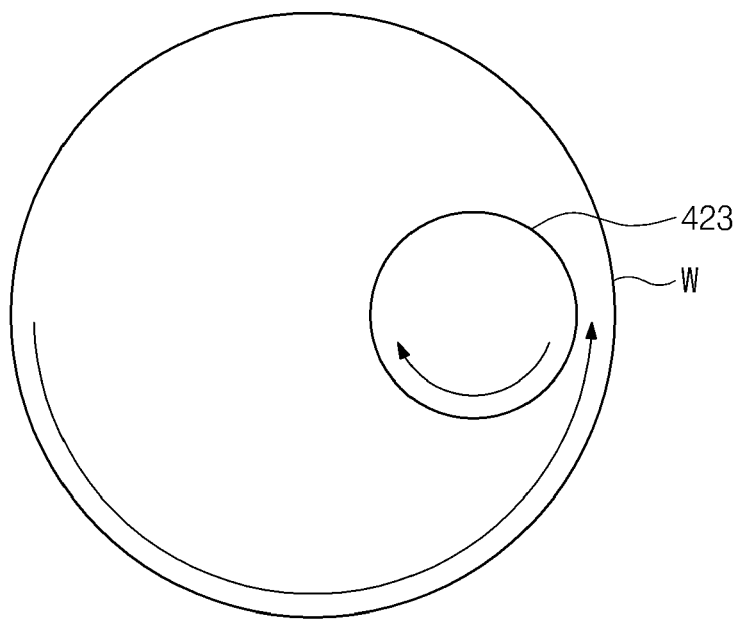

FIG. 3 is a perspective view illustrating the polishing unit 400 of FIG. 1, FIG. 4 is a side sectional view illustrating the polishing unit 400 of FIG. 3, and FIG. 5 is an enlarged view illustrating a polishing head depicted in FIG. 4.

The polishing unit 400 is used in a polishing process for planarizing the surface of a substrate chemically and mechanically. Referring to FIGS. 11 through 13, the polishing unit 400 includes the polishing head 420 and first to third driving members 440, 460, and 480 for driving the polishing head 420 according to operation modes. The polishing pad 423 is mounted on the polishing head 420 for polishing a substrate. During a polishing process, the first driving member 440 rotates the polishing head 420 on the center of the polishing head 420. The second driving member 440 moves the polishing head 420 on a horizontal plane to swing the polishing head 420. The third driving member 480 moves the polishing head 420 upward and downward.

The polishing head 420 includes a cylindrical housing 421 having an opened bottom side. A plate-shaped polishing pad holder 422 is disposed at the opened bottom side of the housing 421, and the polishing pad 423 is coupled to the bottom surface of the polishing pad holder 422. The polishing pad 423 may be attached to a side of a metal plate 424, and a magnet member 422a may be mounted in the polishing pad holder 422 to apply a magnetic force to the metal plate 424 for detachably attaching the other side of the metal plate 424 to the polishing pad holder 422.

A bellows 425 is disposed on the top surface of the polishing pad holder 422. The bellows 425 can be vertically extended by an air pressure applied from a pneumatic member 426. The bellows 425 can be extended to bring the polishing pad 423 into tight contact with a substrate W during a polishing process. If a polishing process is performed in a state where the polishing pad 423 is in tight contact with the surface of a substrate W, the surface of the substrate W can be polished more uniformly and efficiently.

The pneumatic member 426 is connected to an upper portion of the bellows 425 and may be composed of a hollow shaft-shaped member. The longitudinal axis of the pneumatic member 426 may be vertically aligned. The pneumatic member 426 is rotatably supported by bearings 427a and 427b. An air supply line (not shown) is connected to the pneumatic member 426 to supply air to the pneumatic member 426. A valve (not shown) may be installed at the air supply line to close and open the air supply line, and a flow meter (not shown) may be installed at the air supply line to control the flow rate of air supplied through the air supply line. The structures of such devices are well known to one of ordinary skill in the related art, and thus detailed descriptions thereof will be omitted.

During a polishing process, the first driving member 440 rotates the polishing pad 423 on the center of the polishing pad 423. The first driving member 440 includes a first driving motor 441 providing rotation power, and a first belt-pulley assembly 443 configured to transmit rotation power from the first driving motor 441 to the polishing pad 423. The first belt-pulley assembly 443 may include a first driving pulley 443-1, a first driven pulley 443-2, and a first belt 443-3. The first driving pulley 443-1 is disposed at a rotation shaft 411a of the first driving motor 441. The first driven pulley 443-2 is disposed at an outer side of the hollow shaft-shaped pneumatic member 426. The first belt 443-3 is wound around the first driving pulley 443-1 and the first driven pulley 443-2. The first driving motor 441 at which the first driving pulley 443-1 is disposed may be disposed in an end portion of a swing arm 461 (described later) of the second driving member 460, and the first belt 443-3 may be wound around the first driving pulley 443-1 and the first driven pulley 443-2 through the inside of the swing arm 461 in the longitudinal direction of the swing arm 461.

The rotation power of the first driving motor 441 is transmitted to the pneumatic member 426 through the first belt-pulley assembly 443 to rotate the pneumatic member 426, and as the pneumatic member 426 is rotated, the bellows 425, the polishing pad holder 422, and the polishing pad 423 that are sequentially assembled under the pneumatic member 426 are rotated. At this time, the first driving motor 441 of the first driving member 440 may rotate clockwise or counterclockwise. That is, the polishing pad 423 can be rotated clockwise or counterclockwise as shown in FIGS. 14A and 14B. Since the rotation direction of the polishing pad 423 can be varied between clockwise and counterclockwise, a substrate W can be polished while rotating the polishing pad 423 in the same direction as the rotation direction of the substrate W or in the opposite direction to the rotation direction of the substrate W.

The second driving member 460 is used to move the polishing head 420 on a horizontal plane to swing the polishing head 420 on the substrate W. The second driving member 460 includes the swing arm 461, a vertical arm 462, a second driving motor 463, and a second belt-pulley assembly 464. An end of the swing arm 461 is horizontally coupled to a side of the housing 421 of the polishing head 420, and the vertical arm 462 is vertically coupled to the other end of the swing arm 461 from the bottom side of the swing arm 461. The second driving motor 463 provides rotation power to the vertical arm 462 through the second belt-pulley assembly 464.

The second belt-pulley assembly 464 may include a second driving pulley 464-1, a second driven pulley 464-2, and a second belt 464-3. The second driving pulley 464-1 is disposed at a rotation shaft of the second driving motor 463. The second driven pulley 464-2 is disposed at an outer side of the vertical arm 462. The second belt 464-3 is wound around the second driving pulley 464-1 and the second driven pulley 464-2.

The rotation power of the second driving motor 463 is transmitted to the vertical arm 462 through the second belt-pulley assembly 464 to rotate the vertical arm 462 on the center of the vertical arm 462, and as the vertical arm 462 is rotated, the swing arm 461 is swung about the vertical arm 462. Thus, the polishing head 420 on which the polishing pad 423 is mounted is moved along a circularly curved path.

The third driving member 480 is used to move the polishing head 420 upward and downward. The third driving member 480 includes a supporting block 482, a guide member 484, and a linear driving unit 486. The supporting block 482 supports the vertical arm 462, and the vertical arm 462 is rotatably supported by bearings 482a and 482b. The linear driving unit 486 provides driving power for linearly moving the supporting block 482 upward and downward. A linear driving member such as a cylinder member or a linear motor may be used as the linear driving unit 486. The guide member 484 guides linear movements of the supporting block 482.

The linear driving power of the linear driving unit 486 is transmitted to the supporting block 482 to move the supporting block 482 together with the vertical arm 462 supported by the supporting block 482 in upward and downward directions. As the vertical arm 462 is moved upward and downward, the polishing head 420 on which the polishing pad 423 is mounted is moved upward and downward.

In the case of a polishing process is repeatedly performed using the polishing pad 423, the surface of the polishing pad 423 should be periodically polished to adjust the surface roughness of the polishing pad 423. For this, as shown in FIG. 1, the pad conditioning unit 500 is provided in the process chamber 10 at a position close to the polishing unit 400.

Figure 7:
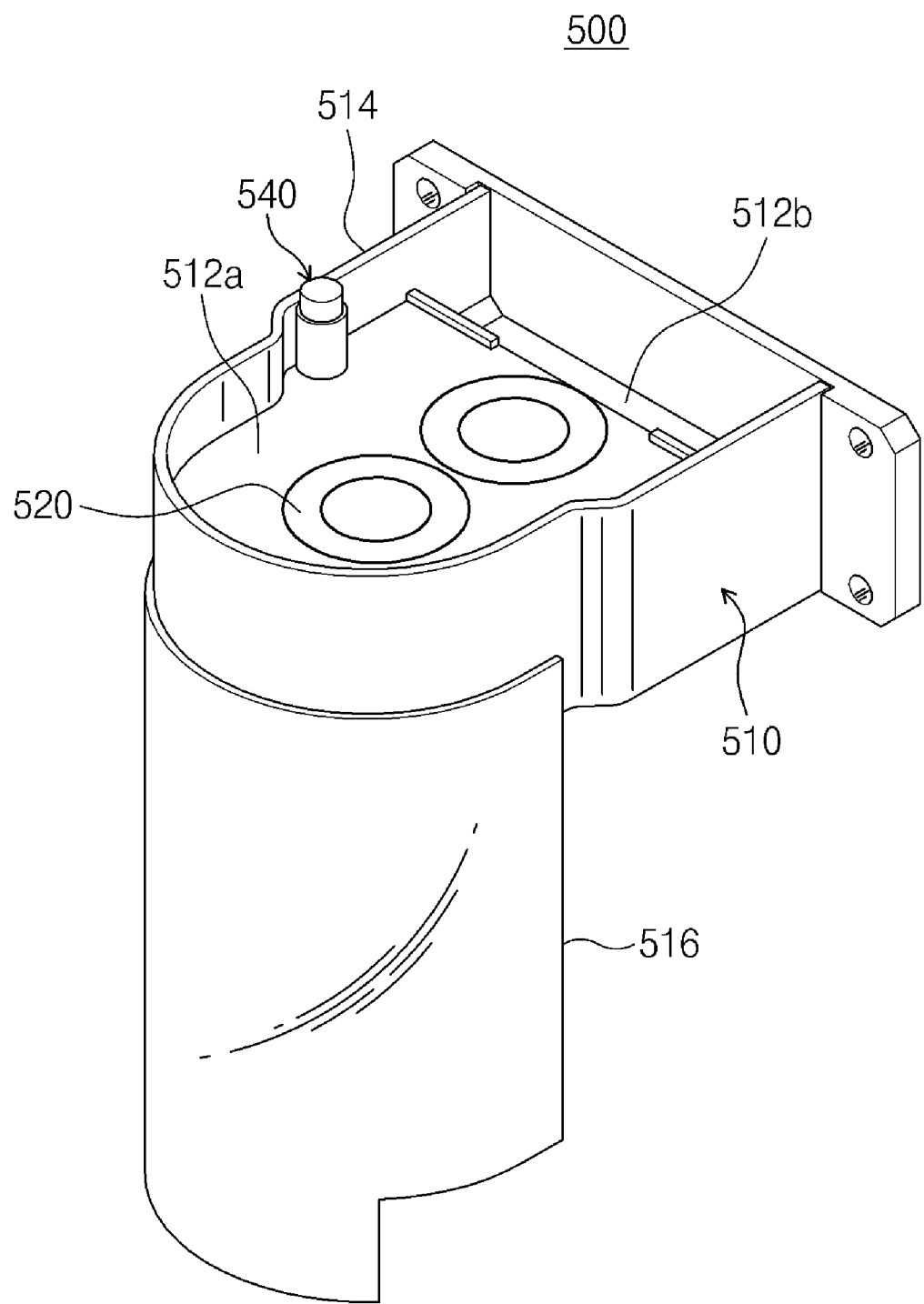
FIG. 7 is a perspective view illustrating a pad conditioning unit of FIG. 1.
Figure 8:
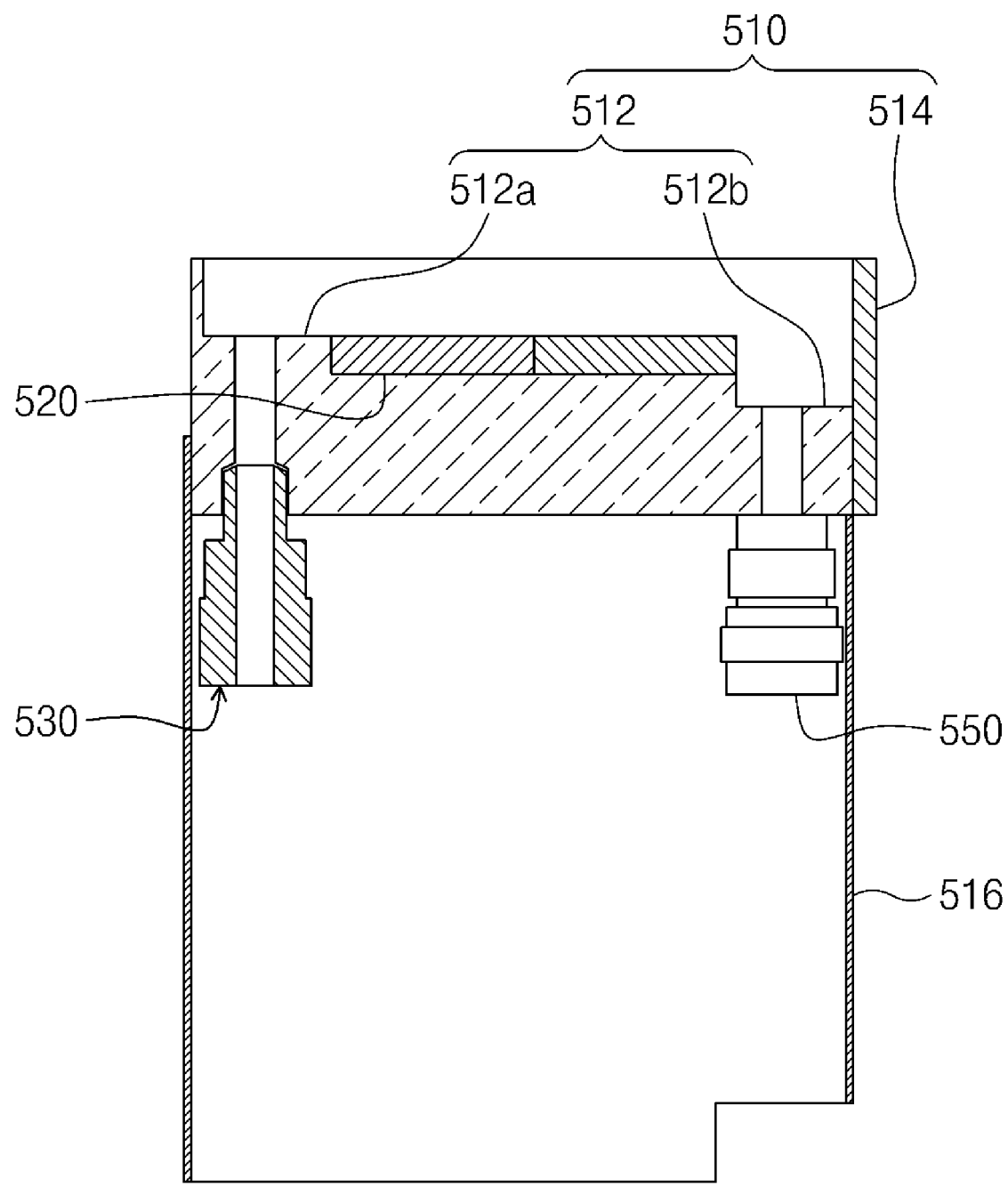
FIG. 8 is a side sectional view illustrating the pad conditioning unit of FIG. 7.
Figure 9:
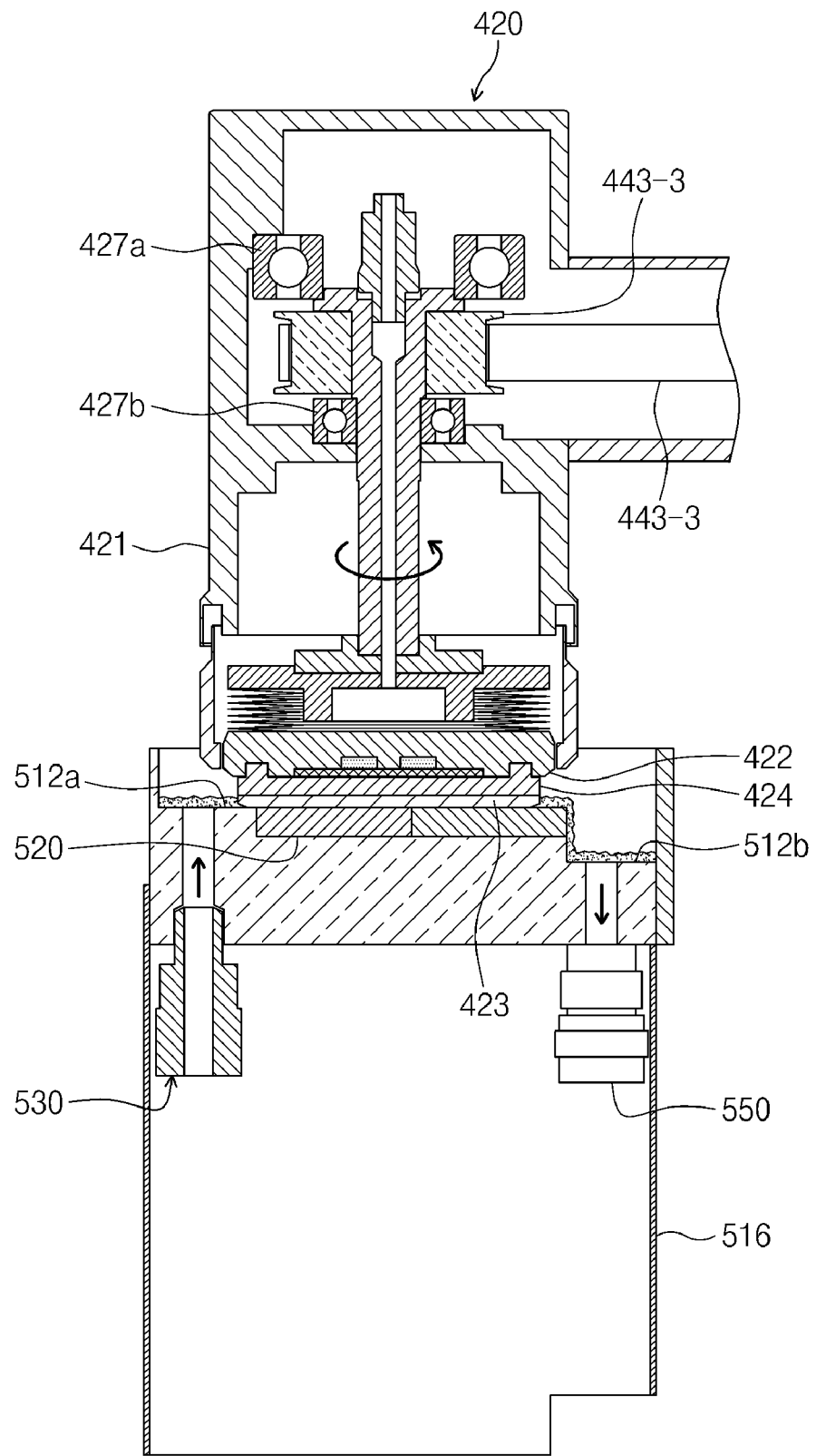
FIG. 9 is a sectional view for illustrating an operational state of the pad conditioning unit.
Figure 10:
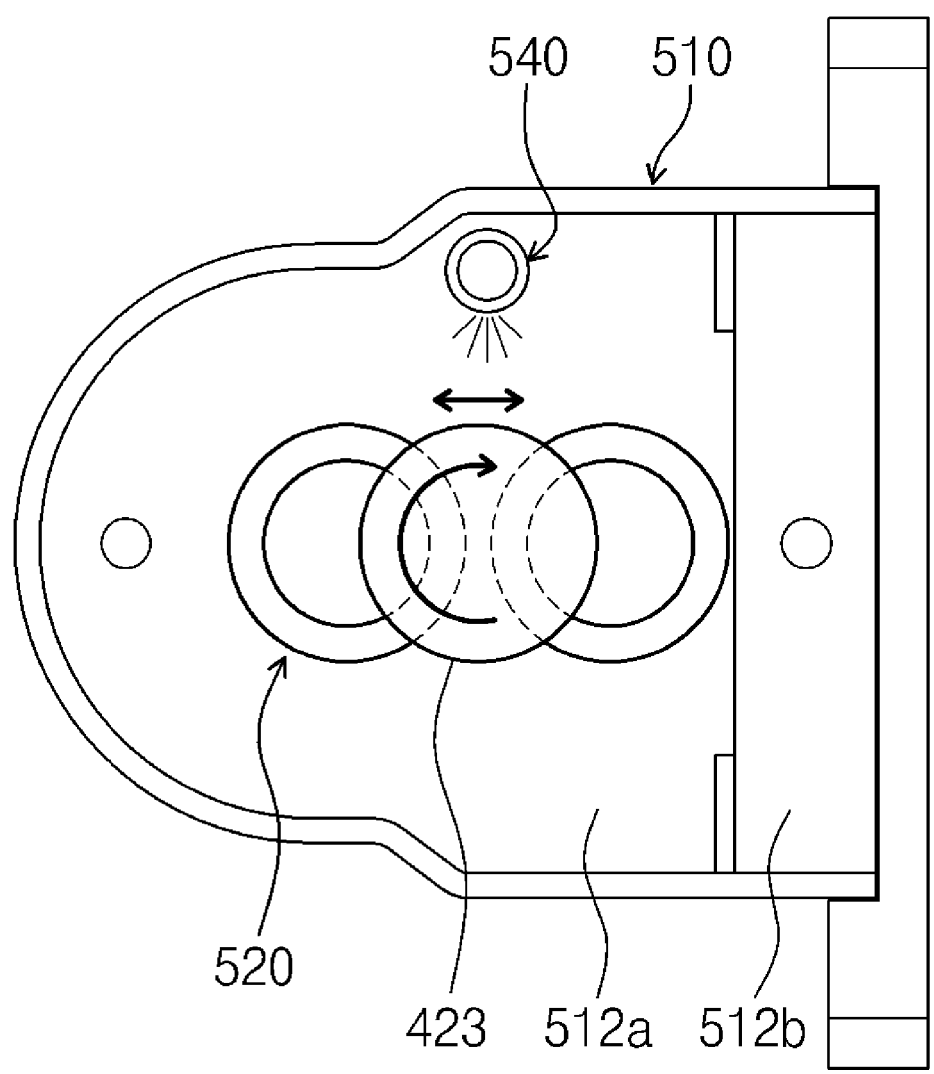
FIG. 10 is a plan view for illustrating an operational state of the pad conditioning unit.

FIG. 7 is a perspective view illustrating the pad conditioning unit 500 depicted in FIG. 1, and FIG. 8 is a side sectional view illustrating the pad conditioning unit 500 depicted in FIG. 7. FIGS. 9 and 10 are views for illustrating an operational state of the pad conditioning unit 500.

Referring to FIGS. 7 through 10, the pad conditioning unit 500 includes a process tub 510 having a bucket shape with an opened top for receiving an end of the polishing head 420 on which the polishing pad 423 is mounted. The process tub 510 includes a bottom wall 512 and a sidewall 514 extending upward from the edge of the bottom wall 512, and a supporting frame 516 is disposed at the bottom side of the bottom wall 512. The bottom wall 512 of the process tub 510 may include a first bottom wall 512a having a first height and a second bottom wall 512b having a second height lower than the first height.

A diamond conditioner 520 is disposed at the first bottom wall 512a of the process tub 510. The diamond conditioner 520 makes contact with the polishing pad 423 for polishing the surface of the polishing pad 423. The diamond conditioner 520 may have a ring or circular shape. The diamond conditioner 520 may have a size corresponding to the size of the first bottom wall 512a. Alternatively, a plurality of diamond conditioners 520 each smaller than the first bottom wall 512a may be provided.

First and second deionized water supply members 530 and 540 are disposed at the process tub 510 to supply deionized water to the first bottom wall 512a of the process tub 510 for removing particles generated while the polishing pad 423 is being polished. The first deionized water supply member 530 is connected to the first bottom wall 512a to supply deionized water to the inside of the process tub 510 through the first bottom wall 512a, and the second deionized water supply member 540 is disposed at a side of the process tub 510 to supply deionized water to the first bottom wall 512a from the upper side of the first bottom wall 512a. Deionized water, which is supplied from the first and second deionized water supply members 530 and 540, removes particles while flowing along the first bottom wall 512a, and then the particle-containing deionized water flows to the second bottom wall 512b lower than the first bottom wall 512a. The particle-containing deionized water is discharged from the second bottom wall 512b through a drain member 550 connected to the second bottom wall 512b.

As shown in FIG. 9, the polishing pad 423 is polished in a state where an end of the polishing head 420 is placed in the process tub 510. At this time the third driving member 480 (refer to FIG. 3) moves the polishing head 420 placed in the process tub 510 upward and downward to bring the polishing pad 423 into contact with the diamond conditioner 520. In this state, as shown in FIG. 10, the first driving member 440 (refer to FIG. 3) rotates the polishing pad 423, and the second driving member 460 (refer to FIG. 3) moves the polishing pad 423 on a horizontal plane for scanning (moving) the polishing pad 423 on the diamond conditioner 520. At this time, the first and second deionized water supply members 530 and 540 supply deionized water to the process tub 510 to remove particles generated while the polishing pad 423 is polished, and then the deionized water is discharged to the outside through the drain member 550.

According to the present invention, a semiconductor substrate can be polished and cleaned in the same process chamber by a single substrate treating method in which substrates are treated one by one.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A single type substrate treating apparatus comprising:
   a process chamber in which a substrate treating process is performed;
   a substrate supporting unit rotatably disposed in the process chamber for placing a substrate on the substrate supporting unit;
   a polishing unit disposed in the process chamber at a side of the substrate supporting unit for polishing the substrate chemically and mechanically, the polishing unit further including a polishing head on which a polishing pad is mounted to polish the substrate, a first driving member configured to rotate the polishing head on a center of the polishing head, a second driving member configured to move the polishing head on a horizontal pane, and a third driving member configured to move the polishing head upward and downward, wherein the polishing head further includes a housing having a cylindrical shape with an opened bottom side, a polishing pad holder disposed at the opened bottom side of the housing for coupling with the polishing pad, a vertically extendable bellows disposed on a top surface of the polishing pad holder, and a pneumatic member configured to apply an air pressure to the bellows, the second driving member further includes a swing arm having an end horizontally coupled to the housing, a vertical arm vertically coupled to the other end of the swing arm, and a second driving motor configured to provide rotation power to the vertical arm, and the third driving member further includes a supporting block configured to rotatably support the vertical arm, and a linear driving unit configured to linearly move the supporting block upward and downward; and a cleaning unit disposed in the process chamber at another side of the substrate supporting unit for cleaning the substrate.

2. The single type substrate treating apparatus of claim 1, wherein the polishing pad is attached to a side of a metal plate, and the polishing pad holder comprises a magnet member configured to exert a magnetic force to the metal plate such that the other side of the metal plate is detachably attached to the polishing pad holder.

3. The single type substrate treating apparatus of claim 1, wherein the first driving member comprises:

a first driving motor;

a first driving pulley in which a rotation shaft of the first driving motor is inserted;

a first driven pulley in which the pneumatic member is installed; and a first belt wound around the first driving pulley and the first driven pulley for transmitting rotation power of the first driving motor from the first driving pulley to the first driven pulley.

4. The single type substrate treating apparatus of claim 1, further comprising:

a second driving pulley in which a rotation shaft of the second driving motor is inserted;

a second driven pulley in which the vertical arm is inserted; and a second belt wound around the second driving pulley and the second driven pulley for transmitting rotation power of the second driving motor from the second driving pulley to the second driven pulley.

5. The single type substrate treating apparatus of claim 1, wherein the first driving motor and the first driving pulley of the first driving member are disposed in the swing arm, and the first belt is wound around the first driving pulley and the first driven pulley through an inside area of the swing arm.

6. The single type substrate treating apparatus of claim 1, further comprising a guide member configured to guide upward and downward linear movements of the supporting block.

7. The single type substrate treating apparatus of 1, wherein the first driving member rotates the polishing pad in a direction opposite to a rotation direction of the substrate placed on the substrate supporting unit.

8. The single type substrate treating apparatus of claim 1, further comprising a pad conditioning unit disposed at another side of the substrate supporting unit to polish the polishing pad of the polishing unit for adjusting surface roughness of the polishing pad.

9. The single type substrate treating apparatus of claim 8, wherein the pad conditioning unit comprises:

a process tub having an opened top side for accommodating an end of the polishing head on which the polishing pad is mounted; and a diamond conditioner disposed at a bottom surface of the process tub for polishing the polishing pad by contact with the polishing pad.

10. The single type substrate treating apparatus of claim 9, wherein the diamond conditioner has a ring shape and is provided in plurality at the bottom surface of the process tub.

11. The single type substrate treating apparatus of claim 9, wherein the bottom surface of the process tub comprises a first bottom surface and a second bottom surface lower than the first bottom surface, and the diamond conditioner is disposed at the first bottom surface.

12. The single type substrate treating apparatus of claim 11, further comprising:

a first deionized water supply member connected to the first bottom surface for supplying deionized water to an inside area of the process tub through the first bottom surface; and a drain member connected to the second bottom surface for allowing deionized water supplied to the inside area of the process tub to be discharged through the second bottom surface.

13. The single type substrate treating apparatus of claim 12, further comprising a second deionized water supply member disposed at the process tub for supplying deionized water to the inside area of the process tub toward the first bottom surface.

14. The single type substrate treating apparatus of claim 9, wherein the third driving member moves the polishing head accommodated in the process tub upward and downward for bringing the polishing pad into contact with the diamond conditioner, the second driving member moves the polishing head on a horizontal plane for scanning the polishing head on the diamond conditioner, and the first driving member rotates the polishing pad.

15. The single type substrate treating apparatus of claim 1, wherein the cleaning unit comprises:

a cleaning liquid supply member configured to supply a cleaning liquid in a direction toward the substrate; and a supersonic cleaning member configured to apply supersonic waves to the cleaning liquid supplied to the substrate.

* * * * *